United States Patent [19]

Shenoi et al.

[11] 4,270,026
[45] May 26, 1981

[54] INTERPOLATOR APPARATUS FOR INCREASING THE WORD RATE OF A DIGITAL SIGNAL OF THE TYPE EMPLOYED IN DIGITAL TELEPHONE SYSTEMS

[75] Inventors: Kishan Shenoi, Fairfield; Bhagwati P. Agrawal, Shelton, both of Conn.

[73] Assignee: International Telephone and Telegraph Corporation, New York, N.Y.

[21] Appl. No.: 98,105

[22] Filed: Nov. 28, 1979

[51] Int. Cl.[3] .............................................. G10L 1/00
[52] U.S. Cl. .......................... 179/15.55 R; 364/900; 364/723; 370/118
[58] Field of Search ................. 179/15.55 R, 15.55 T, 179/1 D; 364/200, 724, 900, 723; 375/103; 370/118, 84

[56] References Cited

U.S. PATENT DOCUMENTS

| 3,973,081 | 8/1976 | Hutchins | 179/1.5 A |
|---|---|---|---|
| 3,988,607 | 10/1976 | Eggermont et al. | 364/724 |
| 4,020,332 | 4/1977 | Crochiere et al. | 364/723 |
| 4,021,616 | 3/1977 | Betts | 179/15.55 T |

OTHER PUBLICATIONS

P. Van Gerwen et al., "A New Type of Digital Filter," IEEE Trans. on Comm., Feb. 1975, pp. 222-234.
M. Tubiana, "Digital Filter Having Integral Coefficients," IBM Tech. Discl. Bull., Mar. 1976, pp. 3322-3324.

Primary Examiner—Charles E. Atkinson
Assistant Examiner—E. S. Kemeny
Attorney, Agent, or Firm—John T. O'Halloran; Jeffrey P. Morris

[57] ABSTRACT

This speech signal digital interpolator increases data (and date rate) by first using an interface unit for rate-changing and zero-stuffing a 32 Kiloword/sec (13 bits/word) signal to form a 1.024 Megaword/sec (13 bits/word) signal, which is then smoothed by a low-pass filter and approximated with 3-bit words. The interface circuit repeats each word a given number of times at the increased rate with each word separated by an all zero bit word having the same number of bits as the digital word to provide an output signal of a specified pattern for each word in the digital signal. A low pass recursive filter responds to the output signal from the interface means and is operative to provide a filtered output digital signal having smooth transitions between each output digital word with said filter output signal at said increased rate and with each output filtered digital word being of a lesser number of bits than the bits in said original signal. Due to the selection of the filter configuration, the coefficients of the filter are restricted to be of the form $2^{-K}$ to thereby implement the recursive filter without the use of digital multipliers.

27 Claims, 14 Drawing Figures

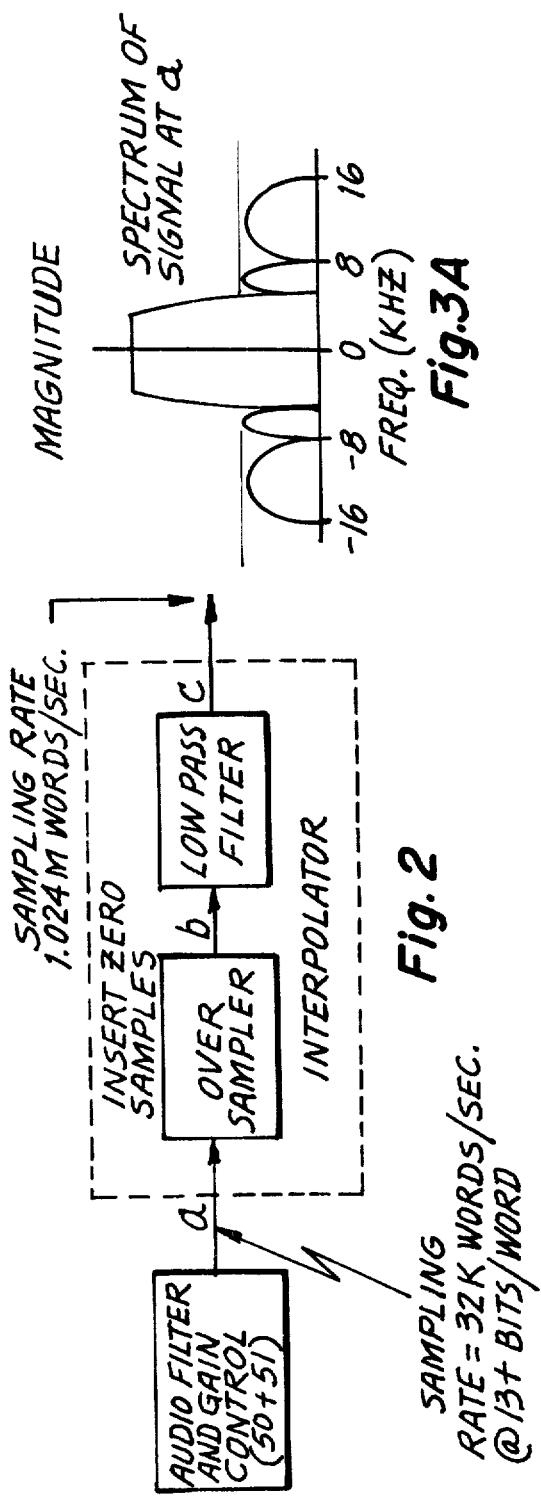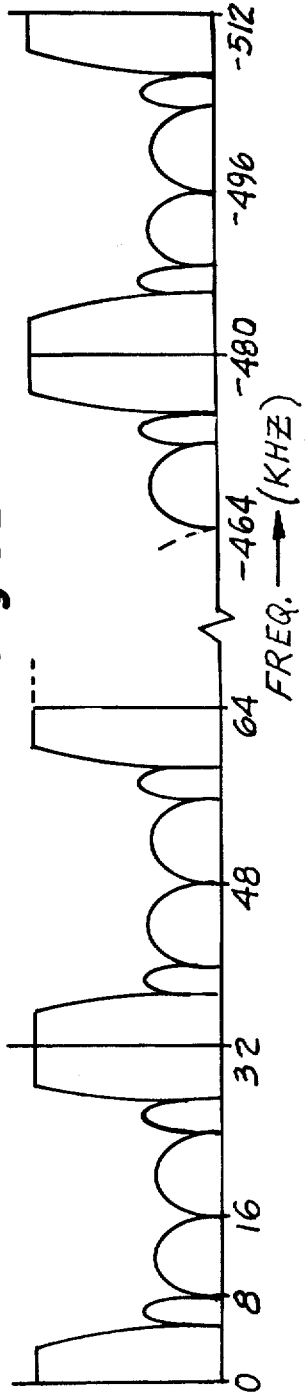

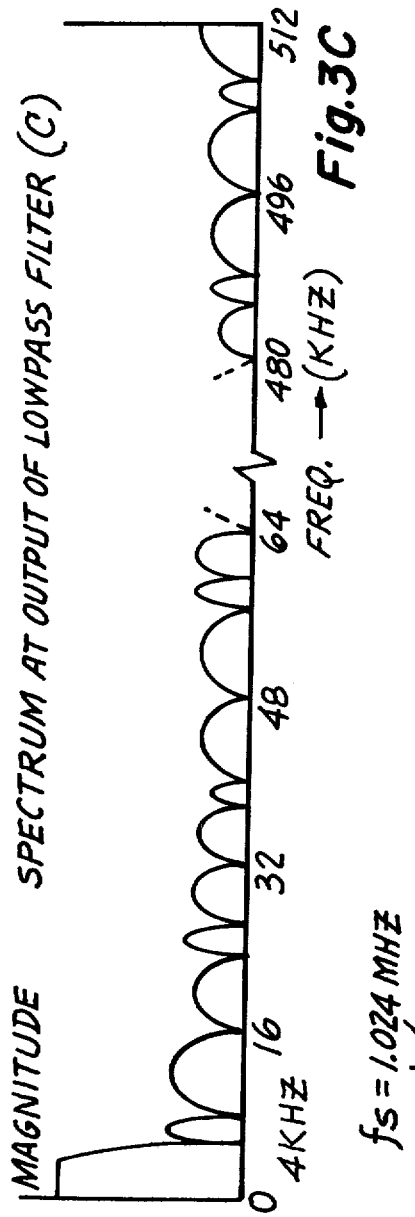
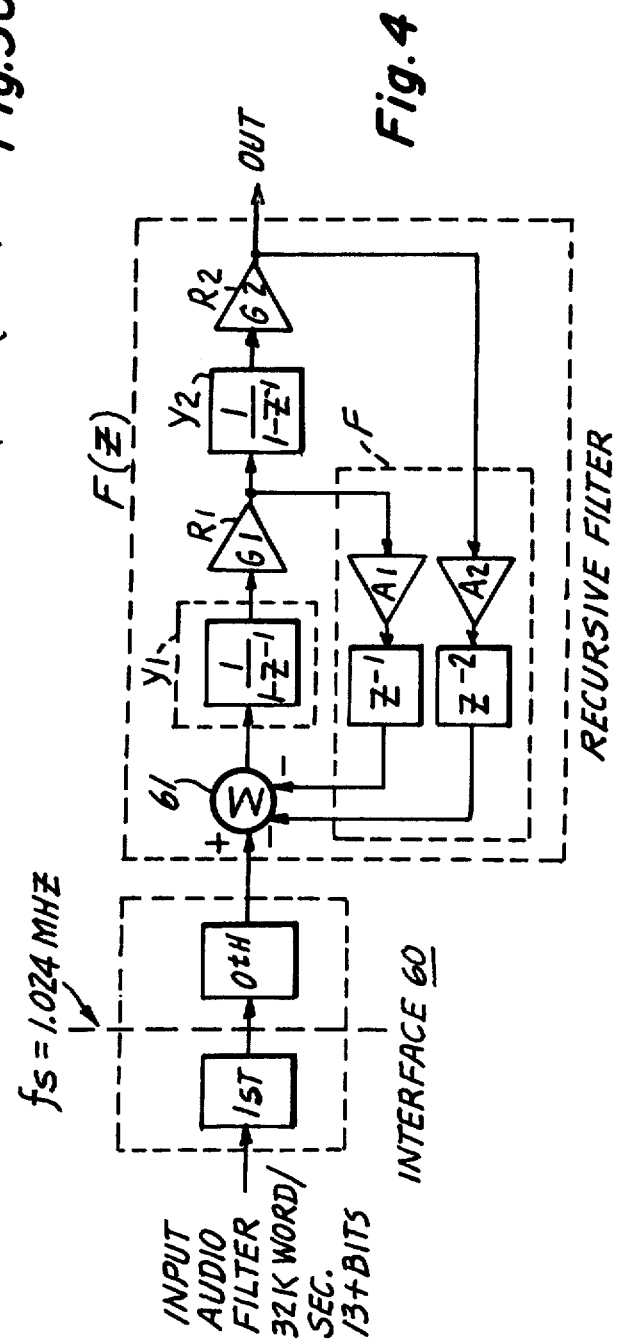

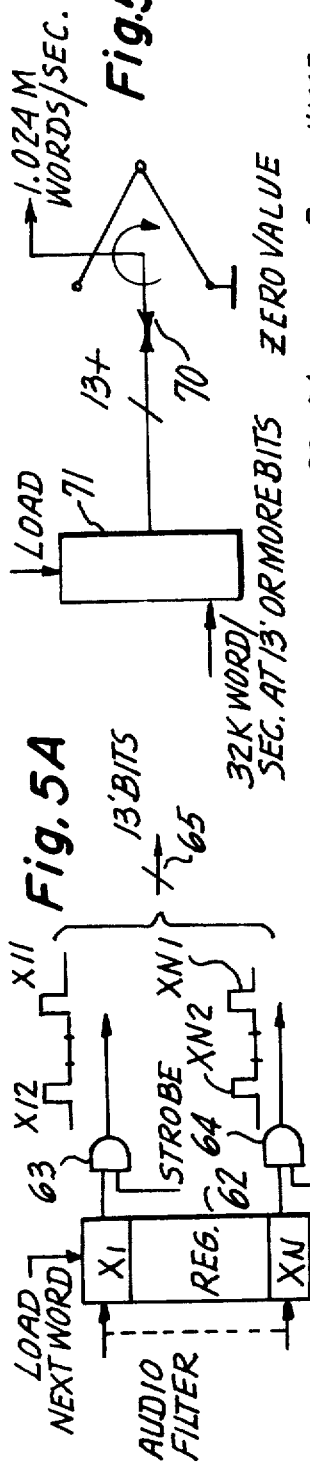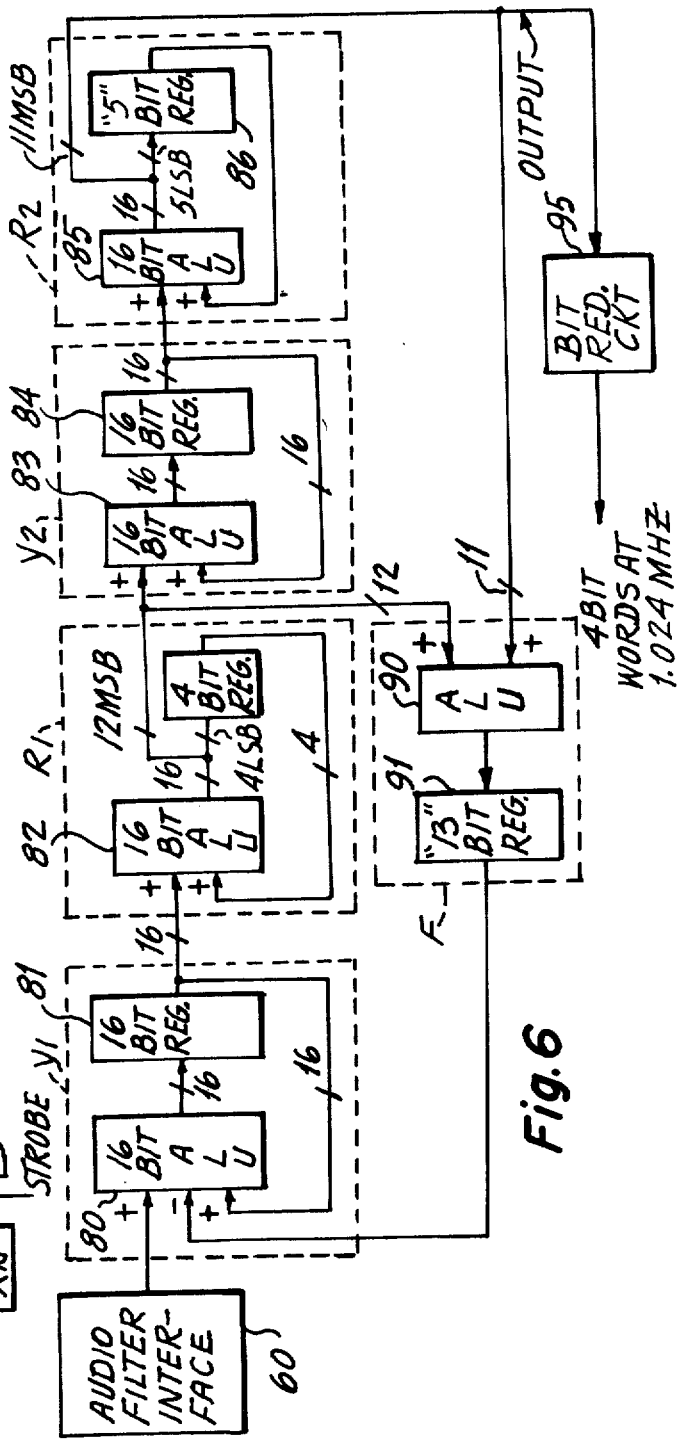

INTERPOLATOR APPARATUS FOR INCREASING THE WORD RATE OF A DIGITAL SIGNAL OF THE TYPE EMPLOYED IN DIGITAL TELEPHONE SYSTEMS

FIELD OF INVENTION

This invention relates to interpolator apparatus and more particularly to an interpolator for increasing the word rate and reducing the number of bits of a digital signal of the type employed in a digital telephone line circuit.

BACKGROUND OF THE INVENTION

In modern day communication systems, digital data is employed for transmission via a switching matrix to various subscribers associated with the system. The use of digital data enables efficient transmission and enables the various system modules to be implemented by integrated circuit techniques which are particularly well suited for the fabrication of digital circuitry.

In a digital telephone system, one converts analog or voice data to digital signals for processing and transmission via a switching matrix. The digital signals are converted back to analog signals to enable subscribers of the system to conventionally communicate. The digital telephony system enables one to implement subscriber line circuits mainly by employing digital circuitry which, as indicated, can be integrated as by LSI, large scale integrated circuits and hence, offers substantial reduction in costs and efficient and reliable operation.

The conversion of signals to analog or digital signals necessitates the use of both digital to analog converters and analog to digital converters. In any event, due to the cost considerations in any telephone system, one must be concerned with economics as well as reliable operation consistent with modern day telephony requirements.

It has been determined that an increase in the sampling or word rate associated with a reduction in the number of bits will enable one to realize simpler and inexpensive configurations for digital to analog converters and hence, reduce hardware costs. This is a prime concern in a telephone line circuit as one such circuit is required for each subscriber.

The increase in word rate as described above has generally been referred to as interpolation with the apparatus for achieving the results referred to as an interpolator. If reference is made to U.S. Pat. No. 4,109,110 entitled DIGITAL TO ANALOG CONVERTER issued on Aug. 22, 1978 to M. J. Gingell, examples of various structures are shown for performing interpolation in conjunction with digital to analog conversion. The advantages of the interpolation technique are also described.

It is apparent that interpolation as well as conversion should be accomplished as economically as possible, while providing reliable operation. In the prior art, one form of an interpolator is referred to as a "triangular window" or a linear interpolator, which devices have been used in conjunction with various types of digital to analog converters. These devices require a great deal of digital circuitry and hence, are associated with relatively large processing delays. Such delays introduce distortion and interference in the processed signals and are undesirable.

An interpolator should also operate to attenuate frequencies outside of the desired analog band to assure that the digital signals are free of interfering frequency components and hence, to assure that the retrieved analog signal is an accurate replica of the original signal.

It is, of course, desirable that the interpolator be capable of accommodating a plurality of different word sizes for different digital coding schemes, with a low processing delay. In prior art interpolators, multipliers were required as rate multipliers and so on. These devices are relatively complicated digital devices and require a great deal of hardware for implementation. Hence, an interpolator according to this invention is provided which eliminates the need for a multiplier.

The interpolator according to this invention provides extremely high attenuation at interfering frequencies, while capable of accommodating flexible word sizes with low processing time delay. As will be described, the interpolator uses relatively economical digital circuitry which is less complex than that required for prior art interpolators. These and other features such as low passband deviation are afforded by employing the interpolator according to this invention.

BRIEF DESCRIPTION OF PREFERRED EMBODIMENT

An interpolator apparatus for increasing the word rate of an input digital signal, said input digital signal consisting of a plurality of digital words, each having the same number of given bits, with said rate of said digital signal being of a predetermined value, comprising interface means responsive to said digital signal for repeating each of said words a given number of times at said increased word rate, with a given separation region between said words as repeated, said interface means including means for inserting a fixed number of zero bit words between said words as repeated wherein said fixed number of zero bits words occupy said given region with each of said zero bit words having the same number of given bits as each digital word, to thereby provide an output signal of a predetermined pattern, low pass digital recursive filter means responsive to said output signal of said predetermined pattern to provide at an output of said recursive filter, a filtered digital signal at said increased rate, manifesting a plurality of digital words, each of a lesser number of bits than said words of said output signal with each word manifesting a value providing a smooth transition between successive words at said increased rate.

BRIEF DESCRIPTION OF THE FIGURES

FIG. 2 is a simplified block diagram useful in understanding the function of an interpolator;

FIGS. 3A,B and C are graphs depicting the frequency spectrum of the digital signal at various outputs indicated in FIG. 2;

FIG. 4 is a schematic diagram in model form of an interpolator according to this invention;

FIGS. 5A and B are schematic circuit diagrams depicting the operation of the interface to a recursive filter forming part of the interpolator;

FIG. 6 is a detailed schematic diagram of an interpolator according to this invention;

DETAILED DESCRIPTION OF INVENTION

Figure 1:
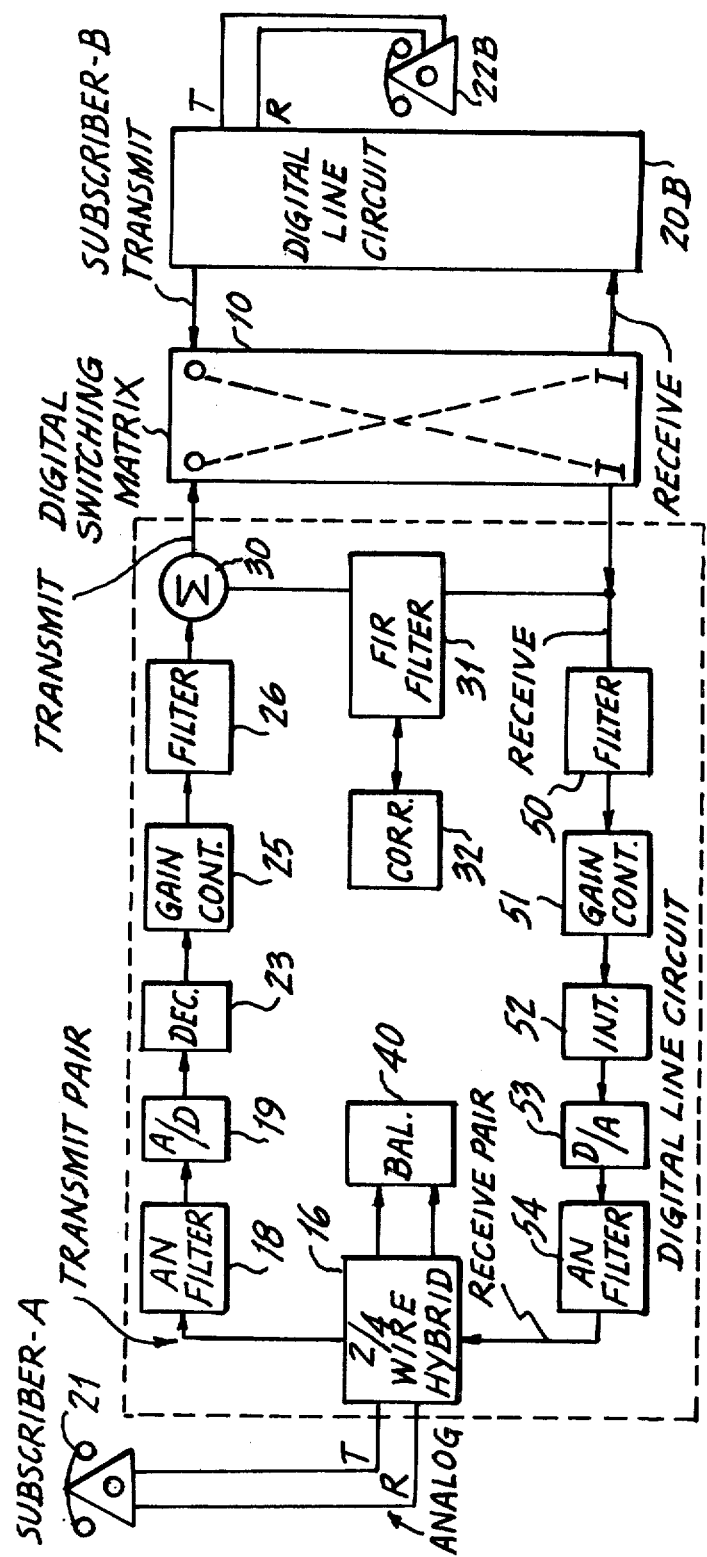
FIG. 1 is a schematic block diagram of a telephone switching system showing a subscriber A and an associated digital line circuit connected via a switching matrix to a subscriber B.

Referring to FIG. 1, there is shown a telephone line circuit as employed in a digital telephone communications system, particularly adaptable for the utilization of an interpolator according to this invention.

Essentially, a single subscriber A is connected via a digital switching matrix 10 to another subscriber B. Each subscriber as A has a separate line circuit 20 associated with his subset and to enable communications between the parties. While subscribers A and B are shown associated with subsets as 21 and 22, it is understood that the subscribers could be trunk locations for connecting to other central offices and so on and as such, would also require a line circuit as 20. In order to simplify the explanation, a single line circuit 20 is shown for subscriber A and it is understood that subscriber B has an identical line circuit 20B as does the plurality of additional subscribers not shown in FIG. 1.

For an example of a digital line circuit employed in a switching system, reference is had to U.S. Pat. No. 4,161,633 entitled SUBSCRIBER LINE-TRUNK CIRCUIT issued on July 17, 1979 to Robert Treiber and assigned to the International Telephone and Telegraph Corp., the assignee herein.

The telephone subset 21 associated with subscriber A is coupled via a two-wire analog line including tip (T) and ring lines (R) to a two-to-four wire hybrid or converter circuit 16. The hybrid 16 is a well known component and essentially connects the two wire analog line to a four wire line. Hence, the output of the hybrid 16 is coupled to two wires shown as a single line and designated as a transmit pair and two wires, (single line) designated as a receive pair. A description of suitable hybrid circuits and operation may be had by reference to a text entitled REFERENCE DATA FOR RADIO ENGINEERS, Sixth Edition (1975) Howard W. Sams, pages 35-16 through 35-20. A digital hybrid circuit is described in copending U.S. Patent Application, Ser. No. 903,458 filed on May 8, 1978 and assigned to the assignee herein.

The transmit pair via hybrid 16 is coupled to the input of an analog filter 18. As one can ascertain, the signal as propagating from the hybrid 16 through the filter 18 is an analog signal. The output of the filter 18 is coupled to the input of an analog to digital converter (A/D) 19. The analog to digital converter 19 may be a pulse code modulator (PCM) device and operates to sample and digitize the analog output signals from filter 18 to provide a digital signal at its output. While one may employ a pulse code modulated signal (PCM), other techniques for analog to digital conversion are applicable. The PCM or digital signal is provided at the output of the A/D 19. This digital signal is applied to the input of a decimator module (DEC) 23. Essentially, the decimator module 23 is a digital filter which functions to decimate or reduce the output word rate of a digital signal applied to its input. In the above discussion, it was indicated that the analog to digital converter 14 is a PCM device, but other types of A/D converters could be employed as well.

In any event, depending upon the signal, a decimator as 23 may be employed to filter or provide attenuation to the digital signal for frequencies outside the band of interest or in this case, for frequencies outside the voice band (0-4 KHz). The decimator 23 is a second order recursive filter having a low pass filter characteristic. The decimator 23 provides a signal at its output at a lower word rate than the word rate available from the analog to digital converter 19. For example, the output digital signal from the A/D converter 19 may be at a sampling frequency (fs) or a word rate of 1.024 MHz with three bits per word. The output of the decimator 23 would be at a sampling frequency (fs) or a word rate of 32 Khz with a word length of 13+ bits per word. An interpolator is the dual of a decimator and operates to increase the word rate as 32 KHz at 13+ bits to a word rate of 1.024 MHz with three bits per word. Reference may be made to "Decimator Apparatus etc." by K. Shenoi et al, Ser. No. 098,094, U.S. application filed Nov. 28, 1979, and assigned to the assignee of this application, for further description of a decimator.

The output of the decimator 23 is applied to a gain control circuit 25 which is the subject matter of a copending application entitled GAIN CONTROL APPARATUS FOR DIGITAL TELEPHONE LINE CIRCUITS by B. P. Agrawal et al, Ser. No. 098,110 filed on Nov. 28, 1979 and assigned to the assignee herein. The operation of the gain control is discussed at length in the referenced application.

The output of the gain control 25 is applied via a non-recursive audio filter 26 to a summing network 30. The filter 26 has a bandwidth determined by the range of audio signals for transmission via the transmission path of the switching network 10. Another input to the summing network is derived from a FIR filter 31. The filter 31 operates in conjunction with a correlator 32 to suppress or cancel the effects of echo in the line circuit. The operation and discussion of the echo suppression circuit has been described in detail in a copending application entitled ADAPTIVE DIGITAL ECHO CANCELLATION CIRCUIT, Ser. No. 020,543 filed on Mar. 14, 1979 for B. P. Agrawal et al and assigned to the assignee herein.

The output of the summer 30 is applied to the switching matrix 40 where it is directed when a connection is made by the switching system, to the receive input of a called subscriber as B. The subscriber's line circuit 20B is identical to the line circuit 20 shown for subscriber A. Hence, as can be ascertained, the digital output signal from the transmit output (O) of the line circuit 20 of subscriber A is applied via the digital switching matrix 10 to the receive input (I) of the line circuit 20B. Examples of digital switching matrices as 10 can be had by referring to a copending application entitled MULTI-PORT DIGITAL SWITCHING ELEMENT, Ser. No. 888,582, now U.S. Pat. No. 4,201,890, filed on Mar. 17, 1978 for A. J. Lawrence et al and assigned to the assignee herein.

The receive input (I) from the matrix 10 is coupled to the receive pair of the digital line circuit. In this manner, the digital signal from the transmit output (O) of the remote subscriber is directed to the input of a non-recursive audio filter 50, having the same bandpass characteristics as filter 26. The output of filter 50 is applied to the input of a gain control circuit 51 which essentially, is of the same configuration as gain control 25. The digital signal as controlled in gain at the output of gain control 51 is applied to the interpolator circuit 52. Basically, the interpolator 52 functions to increase the word rate of the digital signal.

As indicated, in the transmit path, the decimator 23 will decrease the word rate to 32 KHz at thirteen bits or more per word. The interpolator 52 increases the word rate to 1.024 MHz at three bits or more bits per word or to another rate determined by the sampling rate employed. The output of the interpolator 52 is applied to the input of a digital to analog converter (D/A) 53. The D/A converter 53 operates to selectively sample the digital signal at the output of the interpolator 52 to provide at an output, an analog signal which is applied via the analog filter 54 to the hybrid 16.

The interpolator 52 enables one to use a simpler configuration for employing digital to analog conversion and many D/A converters can be employed to convert the digital signal emanating from interpolator 52 to an analog signal. An example of a particular type of D/A converter which can be employed for D/A 53 is described in a copending application entitled DIGITAL TO ANALOG CONVERTER EMPLOYING SIGMA-DELTA MODULATION FOR USE IN TELEPHONE SYSTEMS by B. P. Agrawal et al, Ser. No. 098,103 filed on Nov. 28, 1979 and assigned to the assignee herein.

Referring to FIG. 2, there is shown a simple block diagram useful in explaining the conceptual basis and operation of an interpolator. Conceptually, an interpolator is the cascade of an oversampler which inverts zero valued samples between successive words and a low pass filter at the output.

As seen from FIG. 2, the input to the oversampler is a digital signal at 32 K words/second. The spectrum of this signal is shown in FIG. 3A. Essentially, the spectrum represents the magnitude of the digital signal at the output of the audio filter and gain control. The spectrum is derived and understood by Fourier analysis of such signals and the representation shown in FIG. 3A is conventional and known.

Referring to FIG. 3B, the spectrum of the output of the oversampler is depicted. The waveform is not been repeated but is symmetrically about the O frequency point as the spectrum of FIG. 3A and thus, extends from 0 to 5.12 MHz and from 0 to −5.12 MHz indicating the 1.024 MHz sampling rate. As can be seen from FIG. 3B, the spectrum contains replications (duplicates) of the baseband spectrum at multiples of 32 KHz. The function of the low pass filter is to attenuate all replications outside its pass band or those replications centered at the harmonics of 32 KHz leaving the base band 0 to 4 KHz untouched. The base band of 0 to 4 KHz is the voice band or the band of concern as the analog signal in a telephone system is the voice or speech signal with the majority of energy occupying the 0 to 4 KHz band. Hence, FIG. 3C depicts the desired operation at the output of the low pass filter forming part of the interpolator.

With the above discussion in mine, one now is concerned with the implementation of such an interpolator as determined by the desired sampling rates and the number of bits per word.

One can implement the low pass filter function shown in FIG. 2 by the use of a digital filter designed according to the desired bandwidth. Such filters are known as recursive filters. Many examples of recursive filters are known in the prior art as well as the modes of operation. See, for example, U.S. Pat. No. 3,912,917 issued on Oct. 14, 1975 to H. Nussbaumer and entitled DIGITAL FILTER. This patent describes both recursive and non-recursive filters or transversal filters.

In any event, it is understood that whether a transversal or a recursive filter is implemented, one requires multiplication. Since multipliers are relatively expensive and since such filters require numerous multiplications to be performed, the hardware becomes extremely complicated and relatively expensive. In fact, it was an object of the above cited patent to reduce the number of multipliers required in such filters.

Before proceeding with an explanation of the typical hardware employed with the apparatus, reference is made to FIG. 4 depicting the model of the interpolator necessary to fully understand both the theory and operation of the apparatus.

Shown in FIG. 4 is an input section 60 designated as INTERFACE. It is the interface 60 which permits reliable and efficient operation of the interpolator, which according to this invention and depicted in FIG. 2, includes the interface or oversampler and the recursive low pass filter. Essentially, the input to the interpolator is derived from the audio filter (50 of FIG. 1). The word rate emanating from the filter is 32 KHz at 13+ bits per word. To achieve a word rate increase of thirty-two times specifying a sampling rate of 1.024 MHz at the output of the interpolator, one must consider the spacing between words. In prior art interpolation, the word could be repeated continuously or zero valued samples (zero order hold) could be inserted between words by repeating the current sample ("first order hold"). However, in making such decisions, one has to consider the resulting spectrum and the capability of the recursive filter to suppress harmonics at the 32 KHz rate. Thus, in the interpolator according to this invention, the interface 60 is selected to operate as follows:

For every input word X at a rate of $2^{+5}$ (32) words per millisecond, the interface 60 outputs the following sequence of 32 words at a rate of $2^{+10}$ words/m sec. (1024).

X,0,0,0,X,0,0,0,X,0,0,0,X,0,0,0,X,0,0,0,X,0,0,0,X,0,0,0,X,0,0,-0,X,0,0,0

As can be seen, the word X is repeated every fourth word with the word all zeroes inserted three times between repeated words. By repeating the word X every fourth time, the replicates of the 32 KHz spectrum are attenuated by a factor of four times.

In this repetitive process, due to the operation of the recursive filter, one obtains infinite attenuation for harmonics at 32 KHz, 64 KHz and 96 KHz. The interface 60 is a combination-hold circuit which can be viewed as the cascade of first-order and zero-order hold circuits, which explains the notation "1st" and "0th" in FIG. 4.

The repetitive input from the interface 60 is applied to the input summer or adder 61 of the recursive filter and is at the rate of 1.024 M words/sec. as implemented by the interface.

FIGS. 5A and 5B depict the hardware or circuitry for the interface 60. Essentially, as can be seen from FIG. 5, the 13+ bits from the audio filter are loaded into a parallel register 62. Each bit as $X_1$ to $X_n$ are stored and held for one word duration (31.25 microseconds). Each bit as stored may be associated with a gate as 63 and 64 for $X_1$ and $X_n$.

A strobe or clock pulse gates out the bits as stored during appropriate intervals to enable an output rate of 1.024 M words per second. In FIG. 5A, if bits $X_I$ and $X_n$ were "ones," then at each interval, an output corresponding to the bits is stored and hence, the word X is gated out from 63 and 64. During three successive intervals, the strobe is inactive and hence, three zeroes for each bit are gated out. Thus, the output from the circuit of FIG. 5A is the 13+ bit word X followed by three successive 13+ bit all zero words and so on. This sequence provides thirty-two output words at the 1.024 MHz rate. The output is shown in FIG. 5 by a single output lead 65 intersected by a small line with the notation 13 bits above. This indicates the 13 bit output and the numeral above such a line indicates the number of bits transferred in parallel as seen in FIG. 5B.

FIG. 5B depicts the conventional notation of the interface operation showing a rotating wiper 70 indicating the register scanning sequence. The output from the register 71 is designated as 13 to indicate the parallel bits and the register is loaded with the next word at the rate of 31.25 microseconds. The wiper arm 70 when completing one revolution, gates out the word X followed by three zero words and so on. The process is repeated thirty-two times for each word as above described.

Referring back to FIG. 4, the block diagram of the recursive filter is shown wherein each block depicted specifies a digital transfer function to be implemented. The structure shown in FIG. 4 for the recursive filter is devoid of any multiplication process as the coefficients of the filter are of the form $2^{-K}$ where K is an integer. As will be explained, by specifying the transfer function for the filter, one can perform division by factors of $2^N$. This division is equivalent to multiplication by factors of $2^{-N}$.

The recursive filter section of FIG. 4 is a low pass digital filter of second order and the order is selected to assure attenuation of the out-of-base band signal components. It is understood that the input to the recursive section is from the interface 60 whose operation and configuration was explained above.

A second order Butterworth filter was designed and the transfer function of the digital filter is obtained from the analog filter by using the well known bilinear transformation:

$$S = (Z-1)/(Z+1)$$

If fd is the desired 3-db frequency of the digital filter, the equivalent analog filter would have 3 db frequency WA radians/sec. given by:

$$W_A = \tan \pi f d/f s \approx 2^{-5}$$

fs = sampling frequency
fd = 3-db frequency of digital filter.

The digital transfer function H(Z) can be derived and is:

$$H(Z) = g(1+Z)^2/D(Z)$$

where $d(Z) \approx 1 - [2 - \sqrt{2} W_A + 2\sqrt{2} W_A^2 - 2W_A^4 \cdots] Z^{-1}$
$+ [1 - 2\sqrt{2} W_A + 4W_A^2 - 2\sqrt{2} W_A^3 \cdots] Z^{-2}$ g = is a scaling constant to obtain a desired D.C. Gain.

Since $W_A$ is on the order of $2^{-5}$, the roots of D(Z) or filter poles, are close to $Z-1$. The configuration shown in FIG. 4 for the recursive section is suitable and has the transfer function.

$$F(Z) = \frac{G_1 G_2}{1 - (2 - A_1 G_1)Z^{-1} + (1 - A_1 G_1 + A_2 G_1 G_2)Z^{-2}}$$

If $G_1 = 2^{-4}$ and $G_2 = 2^{-5}$, F(Z) is a low pass filter with a 3 db cut off frequency of approximately 7.5 KHz.

However, the transfer function H(Z) of FIG. 4 between the input to the interface and the output of the recursive section is:

$$H(Z) = \frac{1 + Z^{-4} + Z^{-8} + Z^{-12} + Z^{-16} + Z^{-20} + Z^{-24} + Z^{-28}}{1 + (2-G_1)Z^{-1} + (1 - G_1 + G_1 G_2)Z^{-2}}$$

where
$Z^{-1}$ = a delay by one word at the sampling frequency fs.

where
fs = 1.024 MHz
$Z^{-N}$ = a delay by n words at the sampling frequency fs.

Hence, as seen from FIG. 4, the blocks $R_1$ and $R_2$ perform division by $2^4$ and $2^5$ respectively. Division of binary numbers is extremely simple as can be ascertained from a text entitled ARITHMETIC OPERATIONS IN DIGITAL COMPUTERS by R. K. Richards, D. Van Nostrand (1955), Chapter 5 entitled BINARY MULTIPLICATION AND DIVISION. Division by $2^4$ and $2^5$ is equivalent to multiplication by $2^{-4}$ and $2^{-5}$.

The blocks labelled $Z^{-1}$ and $Z^{-2}$ are delays of one and two words respectively. The blocks designated $Y_1$ and $Y_2$ are accumulators, while the entire block labelled F provides the digital feedback signals where $A_1$ and $A_2$ are gains of one. In the implementation of this filter, recognition was made of the sequence provided by the interface and the filter coefficients are constrained to the powers of two. Therefore, a multiplier can be replaced by binary division.

The reason why the binary dividers can be employed, as will be explained, is that the remainder from each division process is fed back to the input of the divider to be added to the next word to be divided. It has been shown mathematically that this implementation provides an accurate approximation of multiplication by factors as $2^{-N}$ when a division of $2^N$ is afforded.

Referring to FIG. 6, there is shown a block diagram of circuitry used to implement the recursive filter depicted in FIG. 4. Each component specified in FIG. 4 as $Y_1, R_1, Y_2, R_2$ and F are shown in FIG. 6 with the appropriate hardware enclosed within the dashed lines.

As can be seen from FIG. 6, the nomenclature which comprises a number above a line intercepted by a small line is indicative of the number of bits transferred in parallel and as explained in conjunction with FIG. 5. This nomenclature avoids complicated circuit diagrams and makes the description of operation clearer and easier to follow.

As can be seen from FIG. 6, the audio filter interface 60 is the circuitry as shown in FIG. 5, which therefore supplies an increased rate output of 1.024 MHz having the single word X repeated every fourth word followed by three zero words.

Essentially, the module designated as $Y_1$ consists of a sixteen bit arithmetic logic unit (ALU) 80. The arithmetic logic unit 80 is an adder and in essence, is available as a conventional integrated circuit. The contents of the ALU 80 are gated at the output into an output register 81. The register 81 is a standard multibit register also readily available and understood and known to those skilled in the art.

Both the ALU 80 and register 81 show output lines indicative of sixteen bits. As indicated, the input from the audio filter interface 60 is preferably at 13+ bits, but sixteen bit registers can be conventionally and easily employed. It is, of course, understood that the input signal from interface 60 could be less than thirteen or as much as sixteen bits, if desired.

The sequence of process, as will be understood by those skilled in the digital art regarding the recursive filter shown in FIG. 6 is $Y_1, R_1, F, Y_2, R_2$. The 2's complement system is used for number representation and therefore when adding two numbers of differing size, the sign bit of the smaller word is appropriately extended. In the blocks labelled $R_1$ and $R_2$, the smaller word is the error saved from the previous sample interval and is always positive. Hence, in this format, 0's are appended to the most significant bits to make up the correct word size.

It is understood that in regard to the above described process order, all five levels are completed by the recursive filter before the arrival of the next input word.

FIG. 6 does not show the clocking or timing format for performing processing in the order indicated above, but the timing sequence and operation should be immediately apparent to those skilled in the digital filter art and will be immediately ascertained by such persons in viewing FIG. 6.

Essentially, the block labelled $Y_1$ is an accumulator. Briefly, an accumulator is a device which stores a number and upon reception of another number, adds the two numbers and stores the sum. The operation of such devices is extremely well known and many different variations are described in the above entitled text on pages 98, 101-113.

The ALU 80 has three inputs designated as $+,-,+$. This is conventional notation and a word applied to a plus input will be added, while a word applied to a minus input will be subtracted. As one can ascertain from FIG. 6, the ALU 80 and register 81 receives an input from the feedback module F and the nature of this signal will be described as modifying the contents of 80 and 81.

The output from the register 81 is applied to a sixteen bit ALU 82 associated with $R_1$. As indicated, the module $R_1$ performs a division by $2^4$ or by 16. The term ALU is employed for module 82 and essentially, a divider may constitute a chain of binary multivibrators which essentially comprise an accumulator as 82. In module $R_1$, the least significant bits are fed back where they are added to the next word to provide an error signal, which feedback assures that the multiplication will be as desired, as will be explained.

The twelve most significant bits which emanate from ALU 82 are applied to the one input of ALU 90 located in the feedback loop F and are further applied as an input to the sixteen bit ALU circuit 83 associated with $Y_2$. $Y_2$ consists of the ALU unit 83 with a sixteen bit register 84 and is an accumulator as $Y_1$. The output from $Y_2$ is fed to the module $R_2$ which performs a division by $2^5$. As one can see, the configuration of $R_2$ is as $R_1$.

In any event, the output of $R_2$ is eleven bits and the five least significant bits are fed back to be added to the next word via the five bit register 86. The eleven most significant bits are taken from the sixteen bit ALU 85. These eleven bits are also fed, to provide an error signal, to the ALU 90 where they are added with the twelve bits from $R_1$. The sum or the thirteen most significant bits of the sum are stored in the thirteen bit register 91 where they are subtracted from the next word to be processed by the recursive filter. Operation of a digital filter is well known and bandwidth limitations of such filters in operating on digital signals have been explained in many texts as in the above cited patent entitled DIGITAL FILTER, U.S. Pat. No. 3,912,917.

Before proceeding with a further explanation of operation, the operation of modules $R_1$ and $R_2$ will be described so that one may fully appreciate the advantages obtained in feeding back the least significant bits to the next word. In working with binary numbers, it has long been known that a division by two involves a shift in a register to the right. One shift to the right of a binary number represents a division by a factor of two. Two shifts to the right represent a division by a factor of four and hence, N shift to the right represent a division by a factor of $2^N$. Hence, the sixteen bit ALU's 82 and 85 are shifting registers which will shift each word received the appropriate number of bits to the right. In the case of register 82, it is a shift of four places and in the case of register 85, it is a shift of five places. One can see and readily understand that the treatment of binary numbers is universal and hence, a sequence performed by sixteen bits can be explained by a sequence performed with a lesser number of bits, understanding that the same design philosophy is acceptable.

As indicated, one skilled in the art will fully understand the operation of the recursive filter shown in FIG. 6. However, a simple explanation of operation is as follows:

The input to the recursive filter is derived from the interface 60 which, as indicated above, provides a signal at the 1.024 MHz rate where an input word X is followed by three zeroes and the word X is again repeated to produce thirty-two words as described above at the high frequency rate. As one can see, a word X followed by three zeroes and so on, has abrupt transitions. The filter shown in FIG. 6 serves to smooth the values between words.

As one can see from FIG. 6, a word X is operated on by the filter to provide inputs from both $R_1$ and $R_2$ which eventually are stored in the feedback register and added to the next word in proper sequence. Hence, when an all zero word is coupled to the ALU 80, it is modified by the contents of the feedback register 91 at suitable intervals to thereby give the all zero word a weighted value consistent with the actual word X which preceded it. In this manner, each zero word is assured a value according to the operation of the filter so that the output from register 85 has no abrupt transitions, but exhibits a smooth digital variation from word to word. This digital output, when applied to a digital to analog converter, will cause the converter to produce a smooth analog output signal indicative of the weighted values contained in the original signal.

Basically, the filter depicted operates to determine the values of the successive values of each word X within the bandwidth limitations of the filter and further determines the successive values for the words following the X word which are the all zero words. The operation of the filter is basically responsive to the X word or the bits of that word to provide a pulse response over the entire interval indicative of one complete word within the bandpass of the filter. Thus, simply stated, the filter responds to the bit format presented by the interface for one word X which, as shown in conjunction with the description of FIGS. 4 and 5, is repeated according to the format given. The filter provides an output which essentially corresponds to the word X if passed through an ideal filter having a bandwidth of 7.5 KHz. The recursive filter responds accordingly to smooth out the variations caused by the inserted samples derived from the audio filter interface 60.

Figure 7:
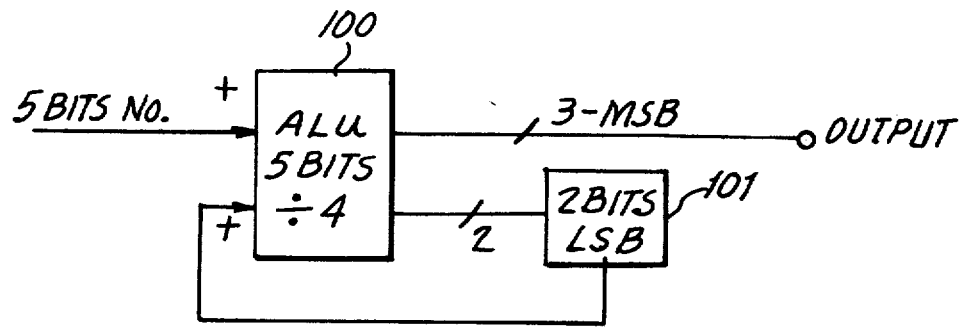
FIG. 7 is a simplified block diagram useful in explaining the operation of a divider useful in this invention.

For purposes of explanation, let us consider the operation of the divider shown in FIG. 7. FIG. 7 shows an ALU plus an output register 100. The above described invention uses 2's complement arithmetic which is very easy to implement and if the first most significant bit is a one, this indicates a negative number and if a zero, it indicates a positive number. In any event, 2's complement arithmetic is easy to work with and logic circuits can be easily implemented. However, the feeding back of the least significant bits as shown in FIGS. 6 and 7, result in a substantial improvement in operation in regard to the dividers employed in FIG. 6 as $R_1$ and $R_2$.

In conjunction with FIG. 7, a simple explanation of operation will be given in terms of straight binary notation which is the most general case of operation. Assume in viewing FIG. 7 that the first number applied to the ALU and register 100 is binary 01010 (decimal 10). Assume that one desires to divide the input number by a factor of four which requires a shift to the right of two. Also assume the last remainder was 10(2). This is added to provide 01100 (12). This number is shifted to provide the output 011 (3) by the ALU and register 100. Since we are concerned in using only three bits at the output, the actual output will be binary number 011 which is 3. This is an error but such an error will exist in any binary implementation where the number of bits is to be reduced and will also occur in 2's complement arithmetic.

In any event, the register 101 is responsive to the least significant bits of the number which are now 00. Now assume that the next number or word applied to the ALU 100 is also 10100 (10). The remainder from the last word as indicated, is 00. Thus, the number 10100 (10) is shifted two places to provide an output of 010 (2), with a remainder of 10 (2) again. The process repeats. As one can see, 10 divided by 4 is 2.5. In this circuit, if the input number were constant at 10100 (10), then the output would be 011 (3) or 010 (2) and the average value would be 2.5. In this manner, the simple circuit shown in FIG. 7 will produce remainder bits which are added to the next word to hence, produce a closer approximation of the actual division.

While the above example is extremely simple, it has been shown mathematically that the remainder that is left after truncation in the stages $R_1$ or $R_2$ of FIG. 6, if fed back and added to the next input sample, substantially reduces the inband noise, as will be shown.

Figure 8:
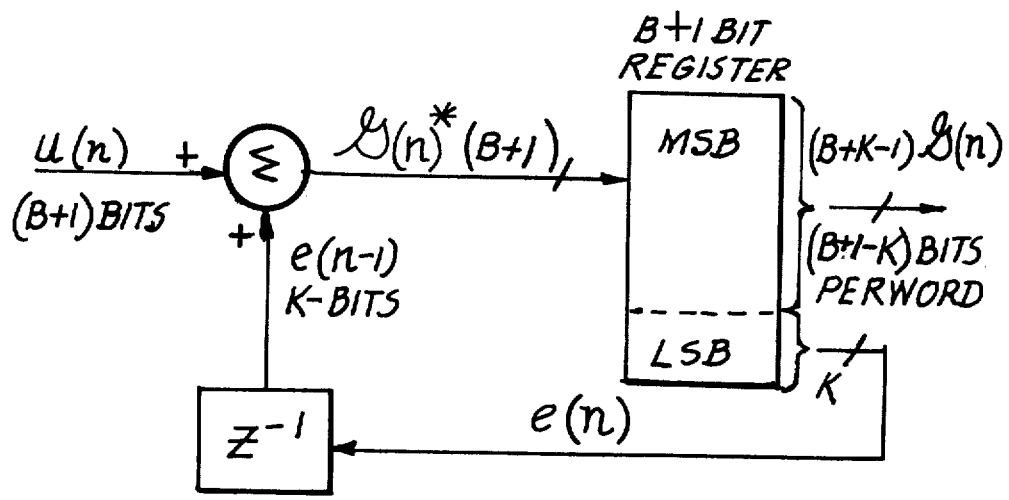
FIG. 8 is a schematic diagram of a divider section useful in explaining the noise operation of such a divider.

Referring to FIG. 8, there is shown a generalized scheme of implementing a division by $2^K$ for the recursive filter section depicted in FIG. 6. Division by $2^K$ is equivalent to a right shift (or a left shift of binary point) of the number by K bits. However, if the low bits (LSB) are discarded, division by $2^K$ will introduce considerable in-band "round-off noise" in the filter output.

Feeding back the error by delaying the least significant bits and adding the same to the next word provides noise spectrum reshaping. In FIG. 8, this is done based on the assumption that 2's complement arithmetic is employed.

The present sample U(n), a (B+1) bit word is added to the previous error e(n−1), of K bits to provide G(n)*. The (B+L−K) most significant bits of G(N)* form the output G(n) and the K least significant bits are stored and used in the next epoch or sampling interval, where they are added to the next word U(n+1). Assume U(n) is an integer in 2's complement notation. Then:

$$G(n)^* = -2^B b_B + 2^{B-1} b_{B-1} + \ldots + 2^K b_K + \ldots + b_0$$
$$G(n) = 2^{B-K} b_B + 2^{B-K-1} b_{B-1} \ldots + 2^0 b_k$$

Division by $2^K$ involves shifting the implied binary point by K places. Using the (B+1−K) bits for the output G(n) would cause an error e(n) given by:

$$2^K e(n) = G(n)^* - 2^K G(n)$$
$$= 2^{K-1} b_{K-1} + 2^{K-2} b_{K-2} + \ldots + 2^0 b_0$$

which is added to the next sample U(n+1) to yield G(n+1)* before G(n+1) is output.

Defining the output error signal s(n) by:

$$s(n) = 2^{-K} U(n) - G(n)$$

Yields:

$$s(n) = [e(n) - e(n-1)]$$

and if See (Z) and S'ss (Z) are the squared magnitude functions of {e(n)} and {s(n)} respectively, then:

$$Sss(Z) = (1-Z)(1-Z^{-1}) See(Z)$$

From this equation, it is clear that the error signal spectrum is zero at D.C. (Z = +1) which shows that the error energy in the frequency band of interest is small.

Thus, the use of the divider configurations $R_1$ and $R_2$ in FIG. 6 improves noise operation of the recursive filter, while eliminating the need for binary multipliers.

Due to the fact that the input word to the filter consists of thirteen bits, the feedback technique employed in sections $R_1$ and $R_2$ is a better approximation than one could anticipate from the example described in FIG. 7. It is also indicated that based on the nature of the digitized signal, each word in the signal consisting of thirteen bits represents the weighted value of an analog signal. Since the analog signal is in the voice band, it tends to be a highly correlated signal and hence, the approximations described above will provide even closer tolerances in operation. In this manner, based on the nature of the input signal and based on the requirements of the digital to analog converter 53 of FIG. 1, the interpolator as above described will provide a proper signal to the digital analog converter to enable the same to convert the digital samples received from the interpolator to analog signals based on the high word rate and lower bit level implemented by the interpolator shown in FIG. 6.

Essentially, due to the operation of the second order recursive filter section and based on the operation of the interface to the recursive filter, the frequency response of the filter shown in FIG. 6 is within −0.22 db from 0 to 3 KHz. The response of the interpolator begins to rapidly fall off beyond 4 KHz and is at −40 db at approximately 28 KHz with attenuation of about −80 db at 32 KHz, 64 KHz, 96 KHz. The attenuation provided by the recursive section is better than −40 db for other frequencies within the spectrum up to 512 KHz.

As can be seen, the interpolator described affords much better attenuation throughout its pass band than the linear interpolator mentioned above and sometimes designated as a triangular window. Essentially, the interpolator provides an increased word rate as described and smoothly approximates the values between words so that there are no abrupt transitions in the signal which is applied to the digital to analog converter. In this manner, the interpolator provides a smooth approximation between successive words, each of which is representative of a weighted value of the analog signal to therefore assure that the D/A converter produces a good replica of the original analog signal.

Based on the fact of using the configuration depicted in FIGS. 4 and 6 for the recursive filter, one can restrict the coefficients in performing the analog to digital transformation to be of the form of $2^{-K}$. In this manner, no multiplier is required. It is, of course, the function of the recursive filter as employed in the interpolator to determine the values of the successive samples of the input signal by essentially forming the signs of algebraic products derived from the input signal and from prior input signals. In any event, in using the above consideration, one does not obtain products which are algebraically added but one performs division and uses the error signal in the dividers to approximate the multiplication as indicated by the reciprocal of the division ratio.

It is again indicated that the prior art recursive filters do employ multipliers which, as indicated, are relatively expensive and difficult to implement. In the above filter, as indicated, one can employ division which is normally associated with noise. Noise power is substantially reduced and kept outside the bandwidth of the system based upon the audio interface as repeating the input word to the recursive section and based on the structural arrangement for the recursive filter.

In the circuit shown in FIG. 6, the number of bits at the output are designated as 11. In any event, it should be apparent to those skilled in the art that the eleven bits can be reduced to any number such as three or four by conventional digital techniques which are well known to those skilled in the art. It is understood that the eleven bit output from the recursive filter is sufficient in that a reduced number of bits are provided within the limited bandpass recursive filter. One can further reduce the eleven bit, for example, by the use of an additional stage 95 at the output of the filter which appears as stages $R_1$ or $R_2$ to thereby obtain three or four bits using the least significant bits in a feedback control loop to correct for errors.

It is, of course, understood that the structure shown in FIG. 6, apart from the implementation of each block as $Y_1, R_1, Y_2, R_2$ and F is of the general format of a second order recursive filter derived by the transformation of a low pass Butterworth filter into its digital equivalent.

Figure 9:
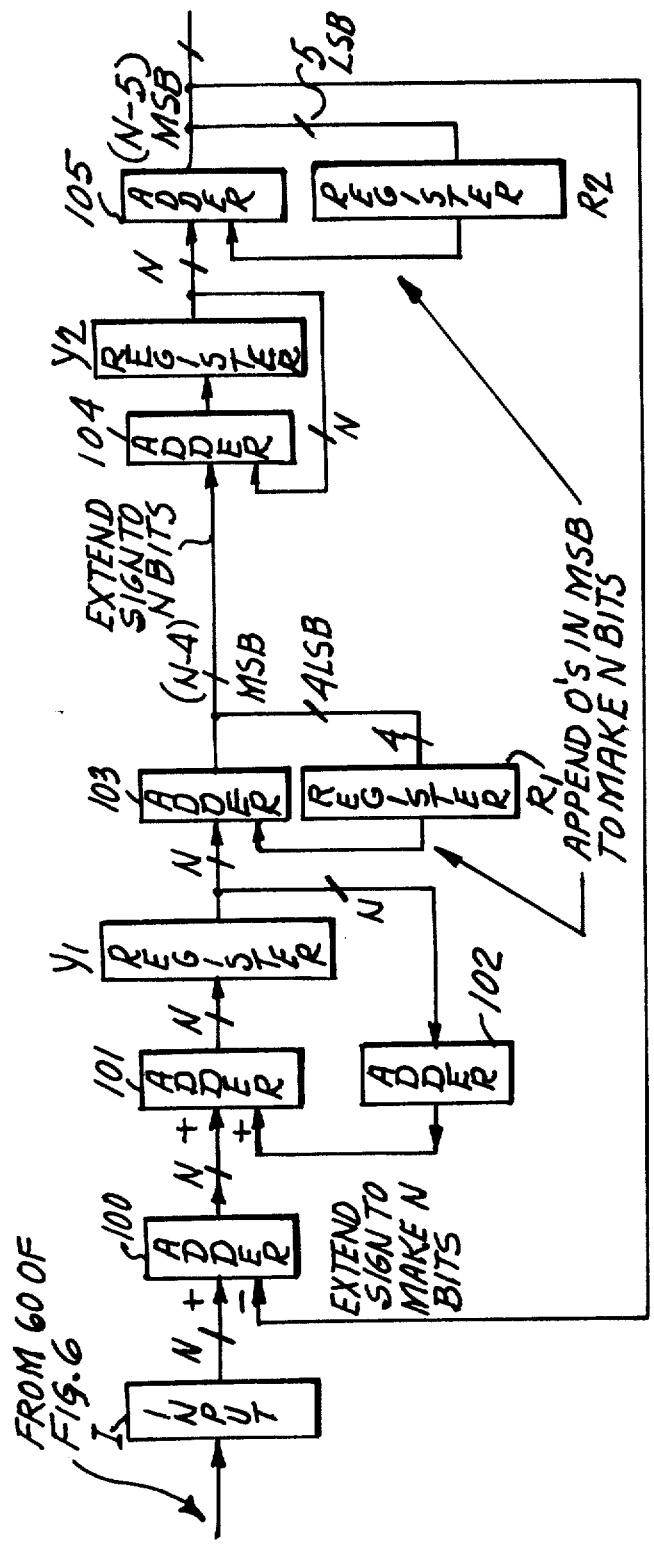
FIG. 9 is a schematic block diagram of an alternate hardware embodiment consisting of the recursive filter section of the interpolator.

Referring to FIG. 9, there is shown still another embodiment of implementing the recursive filter associated with the interpolator. In FIG. 9, one employs binary parallel adders as 100 to 105. Each adder is a parallel adder capable of adding two sixteen bit words. The registers $Y_1$ and $Y_2$ are loaded at the input clock rate of 1024 MHz with the result of the addition provided by the adders. The dividers $R_1$ and $R_2$ are again of the above form and operate to divide by the above noted ratios.

The input to $I_1$ is from the audio interface circuit as 60 of FIG. 6 and $I_1$ operates to store each incoming word of N bits. The speed of operation is determined by the longest chain of adders which are three as 100, 101 and 102 and this length chain is compatible with the above noted clock rates. It is noted that the bit number has been designated as N (where N=16), and zeroes are appended to extend the sign bit as from the output of adder 103 to N bits. This technique is well known and one can accomplish this by repeating the sign bit associated with the reduced bit word. As indicated above, the adders 103 and 105 which operate with the dividing registers $R_1$ and $R_2$ require N bit words to be added and hence, zeroes are appended to the most significant bits prior to application to the adders 103 and 105. This is also a conventional approach. The circuit format in FIG. 9 is particularly well suited for LSI implementation using high density MOS technology.

Figure 10:
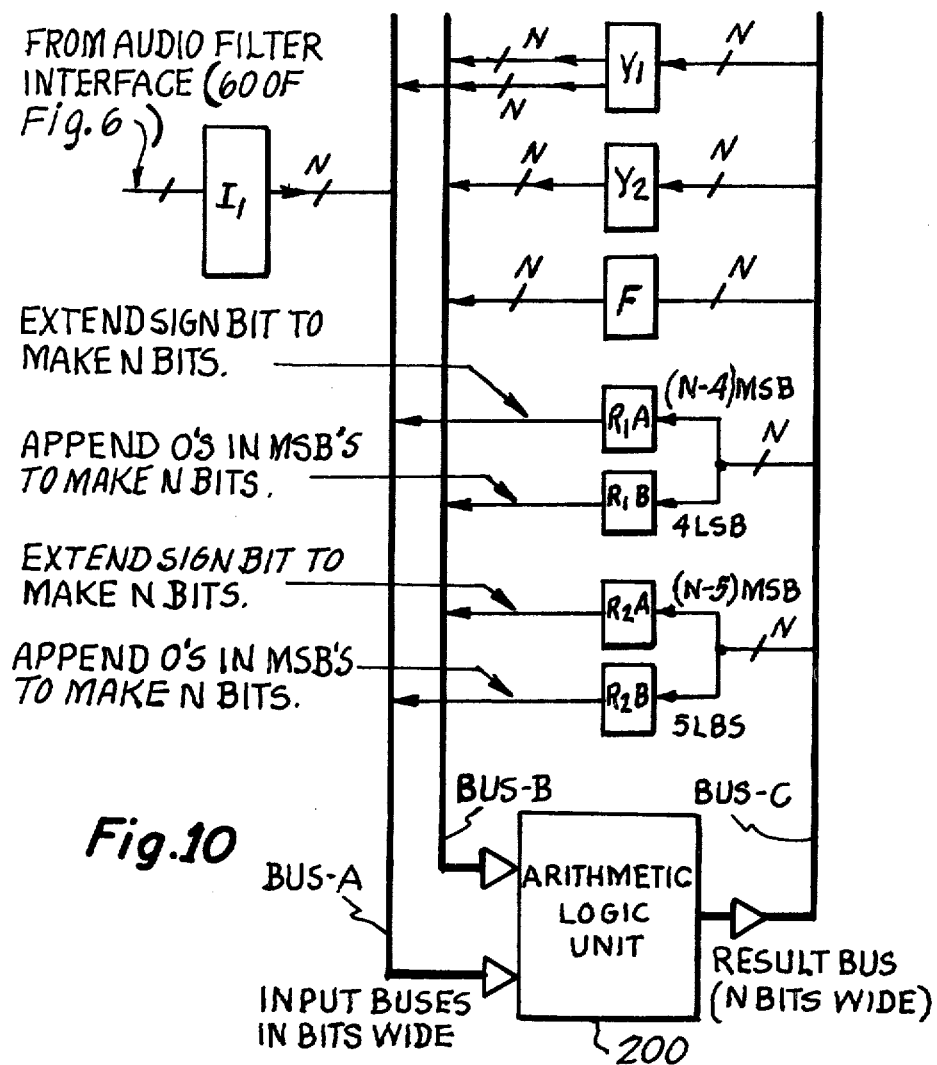
FIG. 10 is still another embodiment of a recursive filter for an interpolator employing a multiplexed arithmetic logic unit.

In FIG. 10, there is shown a technique for implementing the recursive filter associated with the interpolator by employing a multiplexed arithmetic logic circuit (200). All arithmetic and number representation is implemented by using 2's complement arithmetic. The input to the data bus A via $I_1$ is from the audio filter interface circuit as 60 of FIG. 6.

Figure 11:
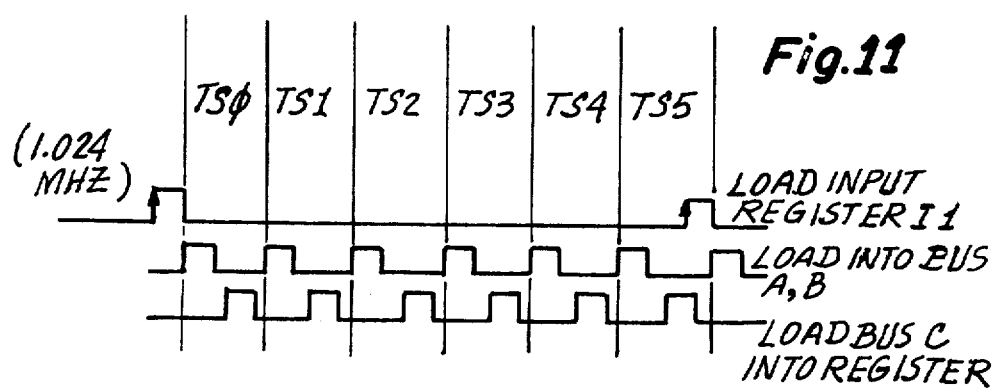
FIG. 11 depicts a series of waveforms explaining the multiplex operation afforded by FIG. 10.

In FIG. 11, a timing diagram is depicted necessary to explain the operation of the multiplex ALU 200 in FIG. 10. In FIG. 11, a sample interval ($\approx 1$ microsecond) is divided into at least six time slots (TS$\phi$ through TS6). The modules designated as $Y_1$, $Y_2$ are registers as is F. This terminology is used to be consistent with the descriptions above and is processed in the order given above as $Y_1, R_1, Y_2, R_2$ and F.

In FIG. 10, the functions performed by $R_1$ and $R_2$ are divided based on the time slot implementation of the logic. Thus $R_1$ is indicated as $R_1A$ and $R_1B$ and essentially, is a single register whose functions are time controlled. In a similar manner, $R_2$ is designated as $R_2A$ and $R_2B$. It is indicated that the operation of a time shared arithmetic logic unit 200 is a known technique and those skilled in the art will immediately understand the nature of operation, as will be explained.

Essentially, an operation is performed by the circuit in FIG. 10 in each time slot. Therefore, in a given time slot, one loads bus A and bus B from the appropriate registers which are shown in FIG. 10 as being coupled to the associated buses. The operation is performed by issuing the appropriate command (plus or minus) to the ALU 200. At the end of the respective time slot, the ALU 200 completes the command operation and the result is applied to the output bus C and loaded into the appropriate register. The technique of multiplexing by using three buses as A, B and C which are time shared is known and based on the following sequence of operation will be immediately understood.

As can be ascertained, the input register $I_1$ receives a digital pattern signal from the audio filter interface circuit where it stores the n bits of the word. The $Y_1$ register is also n bits where n is, of course, equal to sixteen, but as will be ascertained by those skilled in the art, can be thirteen bits or more.

The $R_1$ register consists of the four bit register $R_1B$ and the n-4 bit register $R_1A$. The $Y_2$ register is also sixteen bits as $Y_1$. The $R_2$ register consists of the five bit $R_2B$ register and the n-5 bit $R_1A$ register.

As indicated, all arithmetic operations are represented in 2's complement and hence, the necessary sign extension and the appending of zeroes are conventionally employed to process all words at the n bits. As indicated in conjunction with FIG. 9, both techniques are well known and need not be explained in detail herein. The register labelled F is as $Y_1$ and $Y_2$ and responds to sixteen bits.

The following sequence of operation is implemented in each time slot as depicted in FIG. 11, where the time slots are shown:

| A BUS = A | B BUS = B | C BUS = C INSTRUCTION TO ARITHMETIC LOGIC UNIT (200) |
|---|---|---|
| TIME SLOT $\phi$: | START<br>⎡LOAD A WITH $I_1$<br> B WITH $Y_1$<br> LOAD C INTO $Y_1$<br>⎣END | ADD<br>C = A + B |
| TIME SLOT 1: | START<br>⎡LOAD A WITH $Y_1$<br> B WITH F<br> LOAD C INTO $Y_1$<br>⎣END | C = A − B |
| TIME SLOT 2: | START<br>⎡LOAD A WITH $Y_1$<br> LOAD B WITH ($R_1B$)<br> LOAD C INTO<br> ($R_1A$) + ($R_1B$)<br>⎣END | C = A + B |
| TIME SLOT 3: | START<br>⎡LOAD A WITH ($R_1A$)<br> LOAD B WITH ($R_2A$)<br> LOAD C INTO F<br>⎣END | C = A + B |
| TIME SLOT 4: | START<br>⎡LOAD A WITH $R_1A$<br> LOAD B WITH $Y_2$<br> LOAD C INTO $Y_2$<br>⎣END | C = A + B |
| TIME SLOT 5: | START<br>⎡LOAD A WITH $R_2B$<br> LOAD B WITH $Y_2$<br> LOAD C INTO<br> ($R_2A$) + ($R_2B$)<br>⎣END | C = A + B |

Thus, as can be ascertained from the sequence of operations depicted above, the entire recursive filter section can be implemented by the use of a time shared arithmetic logic unit as depicted in FIG. 10 and according to the timing waveforms shown in FIG. 11.

Thus, as one can ascertain, there are many ways of implementing the structure depicted and all such ways and modifications are deemed to be encompassed within the spirit and scope of the claims appended hereto.

We claim:

1. An interpolator apparatus for increasing the word rate of an input digital signal, said input digital signal consisting of a plurality of digital words, each having the same number of given bits, with said rate of said digital signal being of a predetermined value, comprising:

interface means responsive to said digital signal for repeating each of said words a given number of times at said increased word rate, with a given separation region between said words as repeated, said interface means including means for inserting a fixed number of zero bit words between said words as repeated wherein said fixed number of zero bit words occupy said given region, with each of said zero bit words the same number of given bits as each digital word, to thereby provide an output signal of a predetermined pattern, low pass digital recursive filter means responsive to said output signal of said predetermined pattern, to provide at an output of said recursive filter, a filtered digital signal at said increased rate, manifesting a plurality of digital words, each of a lesser number of bits than said words of said output signal with each word manifesting a value providing a smooth transition between successive words at said increased rate.

2. The interpolator according to claim 1 wherein said pattern for a first input word X is:

$$X,0,0, \ldots 0_N, X,00 \ldots 0_N \ldots X,0,0, \ldots 0_N$$

where $0_N$ = last zero bit word = 0.

3. The interpolator according to claim 2 where $O_N$ is the third zero bit word and hence, said pattern is:

$$X,0,0,0,X,0,0,0 \ldots X,0,0,0.$$

4. The interpolator according to claim 3 wherein said pattern comprises thirty-two words.

5. The interpolator according to claim 1 wherein said low pass recursive filter is a second order digital recursive filter exhibiting a response manifesting a Butterworth analog filter response.

6. The interpolator according to claim 1 wherein said low pass recursive filter has a transfer function F(Z) between input and output as follows:

$$F(Z) = \frac{G_1 G_2}{1 - (2 - G_1)Z^{-1} + (1 - G_1 + G_2)Z^{-2}}$$

where:
$G_1 = 2^{-4}$
$G_2 = 2^{-5}$
$Z^{-1}$ = one word delay at said increased word rate,
$Z^{-2}$ = two word delays at said increased word rate.

7. The interpolator apparatus according to claim 1 wherein
said input digital signal is at a word rate of 32 KHz with at least thirteen bits per word.

8. The interpolator apparatus according to claim 7 wherein
said increased word rate is 1.024 MHz, with said lesser number of bits being less than thirteen bits per word.

9. The interpolator apparatus according to claim 6 wherein
$G_1$ and $G_2$ manifest a binary division by $2^4$ and $2^5$ respectively.

10. The interpolator apparatus according to claim 1 wherein
said recursive filter has a transfer function F(Z) equal to:

$$F(Z) = \frac{G_1 G_2}{1 - (2 - A_1 G_1)Z^{-1} + (1 - A_1 G_1 + A_2 G_1 G_2)Z^{-2}}$$

where:
$G_1$ = a coefficient determined by $2^{-K}$
$A_1$ = a constant
$A_2$ = a constant
$Z^{-1}$ = one word delay at the filter sampling frequency fs.
$Z^{-2}$ = two word delays at the filter sampling frequency fs.

11. The interpolator apparatus according to claim 10 wherein
$G_1 = 2^{-4}$
$G_2 = 2^{-5}$
$A_1 = A_2 = 1$.

12. The interpolator apparatus according to claim 1 wherein
said interface means includes a register having a predetermined number of stages equal to said bits in said input digital signal for storing in parallel, each of said bits manifesting one word, and means for reading out said bits indicative of said word, including means for inserting zero bits after each word bit as read out to provide said pattern of said word followed by said given number of zero bit words.

13. The interpolator apparatus according to claim 12 wherein
said given number of zero bit words is three.

14. The interpolator apparatus according to claim 1 further including
digital to analog converter means having an input responsive to said filtered digital signal at said output of said recursive filter means to provide a smooth analog signal at the output of said digital means.

15. The interpolator apparatus according to claim 1 wherein
said input digital signal is present in the receive path of a telephone line circuit wherein each digital word in said signal represents the weighted value of an analog voice signal occupying a bandwidth of relatively between 0 to 4 KHz.

16. The interpolator apparatus according to claim 1 wherein said low pass digital recursive filter means comprises:
a first accumulator for receiving said output digital signal from said interface means at one input, and adapted to receive a feedback control signal at a second input for providing at an output, a first digital signal indicative of the sum of said input signals,
a first dividing means coupled to the output of said first accumulator for dividing said output signal by a given factor of $2^{-K}$, where K is an integer, to provide a first output divided signal of a lesser number of bits than said accumulator output signal by discarding the necessary number of least significant bits,
a second accumulator means responsive to said divided output signal for increasing the number of bits to said number available at the output of said first accumulator means,
second dividing means coupled to the output of said second accumulator for dividing said increased number of bits by another factor of $2^{-K}$ to provide a second output divided signal of a lesser number of bits than said first,
feedback accumulator means responsive to said first and second divided signals for providing an output feedback control signal indicative of the sum and
means for applying said feedback control signal to said second input of said first accumulator to cause each successive word in said received signal at said input to be modified by said feedback control signal.

17. The interpolator apparatus according to claim 15 further comprising:
means coupled to said first dividing means for storing said least significant bits as discarded by said first dividing means and for applying said bits as stored to said first dividing means to modify the next output signal from said first accumulator according to the magnitude of said bits as stored during the last divided signal.

18. The interpolator apparatus according to to claim 17 further comprising:
means coupled to said second dividing means for storing said least significant bits as discarded by said second dividing means and for applying said bits as stored to said second dividing means to modify the next output signal from said second accumulator according to the magnitude of said bits as stored during the last divided signal.

19. The interpolator according to claim 16 wherein
said first dividing means divides said output signal by a factor of $2^4$, and said second dividing means divides by a factor of $2^5$.

20. An interpolator apparatus for increasing the word rate of an input digital signal, said input digital signal consisting of a plurality of digital words, each having the same number of given bits, with said word rate of said digital signal being of a predetermined value, comprising:
interface means responsive to said digital signal at said increased word rate, wherein each word is presented in a pattern in said output signal indicative of said input word followed by a given number of zero words, each having the same number of bits as said input word, with said last zero bit word again followed by said input word followed by said given number of zero bit words, with said pattern repeating a given number of times to provide said output signal at said increased rate, whereby for a given input word X in said digital signal, said output signal is of the form:

$$X_o, 0_o \ldots 0_{no}, X_1 0_1 \ldots 0_{n1} \ldots X_L 0_{L1} \ldots 0_{nL}$$

where:
$X_o = X_1 = X_L$ = said input word X of said given number of bits
$0_o = 0_l = 0_{L1}$ = first zero bit word of said given number of bits after a respective input word $X_N$
$0_{no} = 0_{nl} = 0_{nL}$ = last zero bit word of said given number of bits after a respective input word $X_N$
where:
$0_o = 0_{no} = 0_l = 0_{Ll} = 0_{nl} = 0_{nL}$, low pass filter digital recursive filter means responsive to said output digital signal to provide at an output, a filtered digital signal manifesting a plurality of digital words at said increased word rate, each of a lesser number of bits than said words of said output signal, with each word manifesting a value providing a smooth transition between successive words at said increased word rate.

21. The interpolator according to claim 20 wherein $0_o$ to $0_{no} = 3$ and therefore said pattern is of the form:

$$X_o,0,0,0,X_1,0,0,0 \ldots X_L,0,0,0$$

where:

$$X_o = X_1 = X_L = X.$$

22. The interpolator according to claim 20 wherein the output pattern of said interface means for a first word X is thirty-two words having the pattern: X,0,0,0,X,0,0,0,X,0,0,0,X,0,0,0,X,0,0,0, X,0,0,0,X,0,0,0,X,0,0,0 ..., with the next word $X_2$ of the same number of bits as X having the same pattern and so on for each successive word, whereby each word as X is repeated every fourth word.

23. A telephone subscriber line circuit for coupling a subscriber to a digital transmission path in a telephone switching system, comprising in combination:
- two-to-four wire converter means coupled to a near-end subscriber line to provide a transmit path and a receive path for said line,
- analog-to-digital converter means for converting near-end analog signals coupled thereto from said two-to-four wire converter in said transmit path, said converter means operative to provide a digital signal comprising a plurality of digital words, each having the same number of bits with each word manifesting a weighted value of said near-end analog signal,
- means for applying said digital signal to said digital transmission path,
- means coupled to said digital transmission path adapted to receive a far end digital signal of the same format as said applied digital signal,
- interpolator means responsive to said digital signal as received for providing a second digital signal having a lesser number of bits than said far digital signal and an increased word rate, said interpolating means comprising:
  - interface means responsive to said received digital signal for repeating each of said words a given number of times at said increased word rate, with a given separation region between said words as repeated, said interface means including means for inserting a fixed number of zero bit words between said words as repeated, wherein said fixed number of zero bit words occupy said given region, with each of said zero bit words having the same number of bits as each digital word, to thereby provide an output digital signal of a predetermined pattern,
  - low pass digital recursive filter means responsive to said output digital signal from said interface means to provide at an output of said filter, a filtered digital signal manifesting a plurality of digital words, each of said lesser number of bits, with each word manifesting a value providing a smooth transition between successive words at said increased rate,
  - digital to analog converter means in said receive path of said line circuit and coupled to said recursive filter and responsive to said output to provide an analog signal, manifesting said far end analog signal,
  - means for coupling said far end analog signal to said two to four wire converter means to enable a subscriber to receive and therefore respond to said far end analog signals.

24. The telephone line circuit according to claim 23 wherein
said far end digital signal as received by said interpolating means is at a 32 KHz word rate with each word having thirteen bits, the output of said interpolating means being at a 1 MHz word rate with each word being at least three bits and less than thirteen.

25. The telephone line circuit according to claim 23 wherein
said analog signals are voice signals having bandwidths relatively between 0 to 4 KHz.

26. The telephone line circuit according to claim 23 further including:
a decimator coupled to the output of said analog to digital converter in said transmit path for reducing the word rate of said digital signal at said output to provide a decimated digital signal for application to said digital transmission path.

27. The telephone line circuit according to claim 23 wherein
said decimated signal has a word rate at 32 KHz.

* * * * *